United States Patent
Chung et al.

(10) Patent No.: US 9,831,487 B2
(45) Date of Patent: Nov. 28, 2017

(54) METHOD FOR MANUFACTURING TRANSPARENT ELECTRODE FILM

(71) Applicant: INKTEC Co., Ltd., Gyeonggi-do (KR)

(72) Inventors: Kwang-Choon Chung, Gyeonggi-do (KR); In-Sook Yi, Gyeonggi-do (KR); Ji Hoon Yoo, Gyeonggi-do (KR); Joonki Seong, Gyeonggi-do (KR); Dae Sang Han, Seoul (KR)

(73) Assignee: INKTEC CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/891,504

(22) PCT Filed: May 16, 2014

(86) PCT No.: PCT/KR2014/004431
§ 371 (c)(1),
(2) Date: Feb. 12, 2016

(87) PCT Pub. No.: WO2014/185755
PCT Pub. Date: Nov. 20, 2014

(65) Prior Publication Data
US 2016/0181592 A1    Jun. 23, 2016

(30) Foreign Application Priority Data

May 16, 2013    (KR) .......................... 10-2013-0056034

(51) Int. Cl.
*B05D 5/12*    (2006.01)
*H01M 4/04*    (2006.01)
(Continued)

(52) U.S. Cl.
CPC .. *H01M 4/0414* (2013.01); *H01L 31/022466* (2013.01); *H01L 31/1884* (2013.01); *Y02E 10/50* (2013.01)

(58) Field of Classification Search
CPC combination set(s) only.
See application file for complete search history.

(56) References Cited

U.S. PATENT DOCUMENTS

2006/0220537 A1* 10/2006 Takeshita ............ H01L 27/3246
                                                     313/505
2012/0325545 A1* 12/2012 Higashitani .......... H05K 9/0094
                                                     174/268
2013/0004753 A1*  1/2013 Majumdar .......... H01L 51/0024
                                                     428/209

FOREIGN PATENT DOCUMENTS

EP    1046945 B1    10/2008
JP    02-066870 A    3/1990
(Continued)

OTHER PUBLICATIONS

International Search Report in International Application No. PCT/KR2014/004431, filed May 16, 2014.
(Continued)

*Primary Examiner* — Austin Murata
(74) *Attorney, Agent, or Firm* — Saliwanchik, Lloyd & Eisenschenk

(57) ABSTRACT

Provided herein is a method for forming a transparent electrode film, the method comprising forming an electrode pattern by printing an electrode pattern on a release film using a metal ink composition; forming an insulating layer by applying a curable resin on the release film on which the electrode pattern has been formed; forming a substrate layer by laminating a substrate on the insulating layer; removing the release film; and forming a conductive layer by applying a conductive material on the electrode pattern from which the release film has been removed.

13 Claims, 6 Drawing Sheets

(51) Int. Cl.
　　　*H01L 31/18*　　　(2006.01)
　　　*H01L 31/0224*　　(2006.01)

(56)　　　　　　References Cited

FOREIGN PATENT DOCUMENTS

| JP | 0780980 A | 3/1995 |
| JP | 2003-062939 A | 3/2003 |
| KR | 1020100109233 A | 10/2010 |
| KR | 1020110025410 A | 3/2011 |
| KR | 10-2011-0100034 A | 9/2011 |
| KR | 101156771 B1 | 6/2012 |
| KR | 1020130026870 A | 3/2013 |
| KR | 1020130037925 A | 4/2013 |
| WO | WO-2011/108869 A2 | 9/2011 |

OTHER PUBLICATIONS

Office Action dated Jul. 3, 2017 in Japanese Application No. 2016-513882.

* cited by examiner

METHOD FOR MANUFACTURING TRANSPARENT ELECTRODE FILM

TECHNICAL FIELD

The present invention relates to a method for producing a transparent electrode film, and more particularly, to a method for producing a transparent electrode film having excellent surface roughness and low resistance by printing a metal ink composition using a release film and then depositing or coating a conductive material on top of the metal ink composition, thereby forming a transparent electrode film.

BACKGROUND

As various home appliances and communication devices become digitalized and highly advanced, implementation of portable displays is in desperate need. In order to realize a portable display, the materials for producing an electrode for display should not only be transparent and exhibit low resistance, but also have a high flexibility to ensure mechanical stability, and a coefficient of expansion that is similar to that of substrates such that even when a device is overheated or under a high temperature there is no short circuits or significant change in the sheet resistance.

Examples of well known conventional materials that can be used as a transparent conductive material include oxides, carbon nanotube (CNT), graphene, polymer conductors, metal nano wires and the like. Among these materials, indium tin oxide (ITO) is widely used to form a thin film layer in a vacuum method, but indium tin oxide is a ceramic material that shows low resistance against flexing or bending of a substrate and therefore easily cracks and causes deterioration of electrode properties. Not only that, due to the rapid expansion of markets for flat panel displays, mobile devices, and touch panels and the limited reserves of indium which is the main material of indium tin oxide (ITO), the price of indium continues to increase causing a threat to the cost competitiveness of transparent conductive films. Therefore, in order to take a dominant position in the fierce competition of display technologies in the near future, it is important to develop an alternative material that could resolve the problems of ITO electrodes.

In the case of polymer conductors, polyacetylene, polypyrrole, polyphenol, polyaniline, PEDOT:PSS and the like are generally used to produce transparent conductive films. However, most polymer conductors have low solubility, the processes involved are fastidious, and it shows colors since its energy band gap is below 3 eV. Furthermore, when a polymer conductor is coated with a thin film in order to increase its transmissivity, its sheet resistance would increase, which causes a problem in actually being used as a transparent electrode. Furthermore, most polymer conductors lack atmospheric stability, and are therefore easily oxidized in the air, deteriorating the electrical conductivity. Therefore, securing the atmospheric stability is an important element in using polymer conductors.

Much research is being carried out on transparent conductive films using CNT, graphene, or metal nano wire, but these materials have problems that need to be solved in order to be used as low resistance transparent conductive films, and thus have not reached the commercialization level yet.

In order to resolve the aforementioned problems, new studies are being conducted on methods for forming fine intaglio grooves using imprinting methods and then charging a metal of low resistance, and in relation thereto, there is a method for pressing a UV curable resin with a fine mold, imprinting, and then charging an Ag paste to form a transparent conductive film. In this method however, since it is difficult to adjust the thickness of the Ag pattern to control the surface roughness of the pattern film, there are limitations to applying the method to applications where electrodes need to be contacted.

Not only that, since the need for large scale flexible displays is recently increasing, there is an urgent need to develop an electrode material having excellent resistance characteristics, flexibility, adaptability with organic materials, and surface flatness.

Thus, there is a need to develop a method for producing a transparent electrode where fine electrode patterns are formed having excellent surface roughness and that may be easily used in contacts between electrodes.

SUMMARY

A purpose of the present invention is to resolve the aforementioned problems of conventional techniques, that is, to provide a method for producing a transparent electrode film for display by printing a metal ink composition on a release film to form an electrode pattern and then removing the release film, thereby forming a transparent electrode film for display having excellent surface roughness.

Another purpose of the present invention is to provide a method for producing a transparent electrode film for display by printing a metal ink composition on a release film to form an electrode pattern and then forming a substrate layer, thereby forming a transparent electrode film for display having excellent adhesion and low resistance properties.

Another purpose of the present invention is to provide a method for producing a dual-layered hybrid transparent electrode film by hybridizing a conductive metal ink composition having mechanical and electrical characteristics and an oxide electrode having excellent surface characteristics.

Another purpose of the present invention is to provide a method for producing a transparent electrode film for display by printing an electrode pattern using a metal ink composition, and removing residue of the metal ink composition from areas besides the electrode pattern area, so that the fine pattern has low resistance and excellent transmissivity that had been difficult to be implemented according to conventional techniques.

Another purpose of the present invention is to provide a method for producing a hybrid type transparent electrode film for display with significantly improved electric conductivity by forming a conductive material on an electrode pattern after removing a release film.

According to one aspect of the present invention, there is provided a method for forming a transparent electrode film, the method including forming an electrode pattern by printing an electrode pattern on a release film using a metal ink composition; forming an insulating layer by applying a curable resin on the release film on which the electrode pattern has been formed; forming a substrate layer by laminating a substrate on the insulating layer; removing the release film; and forming a conductive layer by applying a conductive material on the electrode pattern from which the release film has been removed.

The release film may be formed by applying a silicon-based or acryl-based releasing agent on a thermo-resistant film.

The metal ink composition may include at least one of a metal complex compound, metal precursor, spherical metal particles, metal plate and metal nano particles.

The electrode pattern may be printed on a surface of the release film by a gravure printing method, flexo printing method, offset printing method, reverse offset printing method, dispensing, screen printing method, rotary screen printing method, or inkjet printing method.

The forming an insulating layer may include applying the curable resin on entire surface of the release film such that grooves between the electrode pattern are filled.

A height of the insulating layer between the electrode pattern may be the same or higher than a height of the electrode pattern.

The forming an insulating layer may include forming two or more insulating layers by applying the curable resin two or more times.

The substrate may be laminated on the insulating layer by hot compression, or by adhesion using an adhesive agent.

The method may further include managing residue metal ink composition by removing the residue metal ink composition that remains between the electrode pattern when printing the electrode pattern at the forming an electrode pattern, after the removing of the release film.

The managing residue metal ink composition may include removing the residue metal ink composition by dissolving the residue metal ink composition using an etching solution, and pushing the dissolved residue metal ink composition using a residue managing member.

The etching solution may include at least one of an ammonium carbamate compound, ammonium carbonate compound, ammonium bicarbonate compound, carboxylic acid compound, lactone compound, lactam compound, cyclic acid anhydride compound, acid-base complex, acid-base-alcoholic complex and mercapto compound, and an oxidizing agent.

The residue managing member may be a doctor blade, wiper, or brush.

The forming a conductive layer may include depositing or printing the conductive material on the electrode pattern from which the release film has been removed.

The conductive material may be ITO, AZO, CNT, graphene, or conductive polymer.

According to another aspect of the present invention, there is provided a method for producing a transparent electrode film, the method comprising forming an electrode pattern by printing an electrode pattern on a release film using a metal ink composition; forming an insulating layer by applying a curable resin such that grooves between the electrode pattern are filled; forming a substrate layer by laminating a substrate on the insulating layer; removing the release film; managing residue metal ink composition by removing the residue metal ink composition remaining between the electrode pattern while printing the electrode pattern; and forming a conductive layer comprising a conductive material on the electrode pattern from which the release film has been removed.

The release film may be formed by applying a silicon-based or acryl-based releasing agent on a thermo-resistant film.

The forming an insulating layer may include applying the curable resin on an entire surface such that grooves between the electrode pattern are filled.

The curable resin may be a thermosetting resin or UV curable resin.

The substrate may be laminated on the insulating layer by hot compression, or by adhesion using an adhesive agent.

The managing residue metal ink composition may include removing the residue metal ink composition by dissolving the residue metal ink composition using an etching solution, and pushing the dissolved residue metal ink composition using a residue managing member.

The etching solution may include at least one of an ammonium carbamate compound, ammonium carbonate compound, ammonium bicarbonate compound, carboxylic acid compound, lactone compound, lactam compound, cyclic acid anhydride compound, acid-base complex, acid-base-alcoholic complex and mercapto compound, and an oxidizing agent.

The residue managing member may be a doctor blade, wiper, or brush.

The conductive material may be ITO, AZO, CNT, graphene, or conductive polymer.

The forming a conductive layer may include depositing or printing the conductive material on the electrode pattern.

According to another aspect of the present invention, there is provided a method for producing a transparent electrode film, the method comprising forming an electrode pattern by printing an electrode pattern on a release film using a metal ink composition; forming an insulating layer by applying a curable resin on the release film where the electrode pattern is formed; removing the release film; and forming a conductive layer by applying a conductive material on the electrode pattern from which the release film has been removed.

The release film may be formed by applying a silicon-based or acryl-based releasing agent on a thermo-resistant film.

The forming a conductive layer may include depositing or printing the conductive material on the electrode pattern from which the release film has been removed.

The conductive material may be ITO, AZO, CNT, graphene, or conductive polymer.

Since a transparent electrode film is produced by printing a metal ink composition on a release film to form an electrode pattern and then removing the release film, the electrode pattern is exposed on the surface in the direction where the release film is removed, which enables easy contact between electrodes, and thereby it is possible to provide a method for producing a transparent electrode film for display having excellent surface roughness.

Since an electrode pattern and an insulating layer are formed sequentially on the release film, and a substrate layer is formed by hot compression bonding method or adhesion by an adhesive agent, it is possible to provide a method for producing a transparent electrode film for display having improved adhesion between the electrode pattern and substrate layer.

By using a conductive material comprising a metal complex compound or metal precursor as a metal ink composition to form an electrode pattern, it is possible to improve all of optical, electrical, and mechanical characteristics.

By dissolving using etching solution and thus removing the residue metal composition remained on area where the electrode pattern is not formed after removing the release film, it is possible to improve the transmissivity and withstand voltage.

The hybrid type transparent electrode film where conductive materials of ITO, AZO and the like are formed on the fine electrode pattern provides excellent interface characteristics between two electrodes, and may thus be applied to applications requiring high conductivity and reliability.

Not only that, according to the present disclosure, it is possible to form an electrode pattern with a conductive metal ink composition, and form a conductive layer made of a conductive material on the electrode pattern, thereby providing an optimized transparent electrode with excellent electric conductivity and transmissivity.

Especially, a transparent electrode film of the present invention provides excellent interface characteristics between two electrodes, and may thus be applied to applications requiring high conductivity and reliability. The present invention may also realize a dual-layered hybrid transparent electrode film having improved flexibility so that it may be easily applied to flexible displays.

The effects of the present invention are not limited to the aforementioned effects, and other effects will be apparent for one skilled in the art from the description in the claims.

REFERENCE NUMERALS IN DRAWINGS

Figure 1:
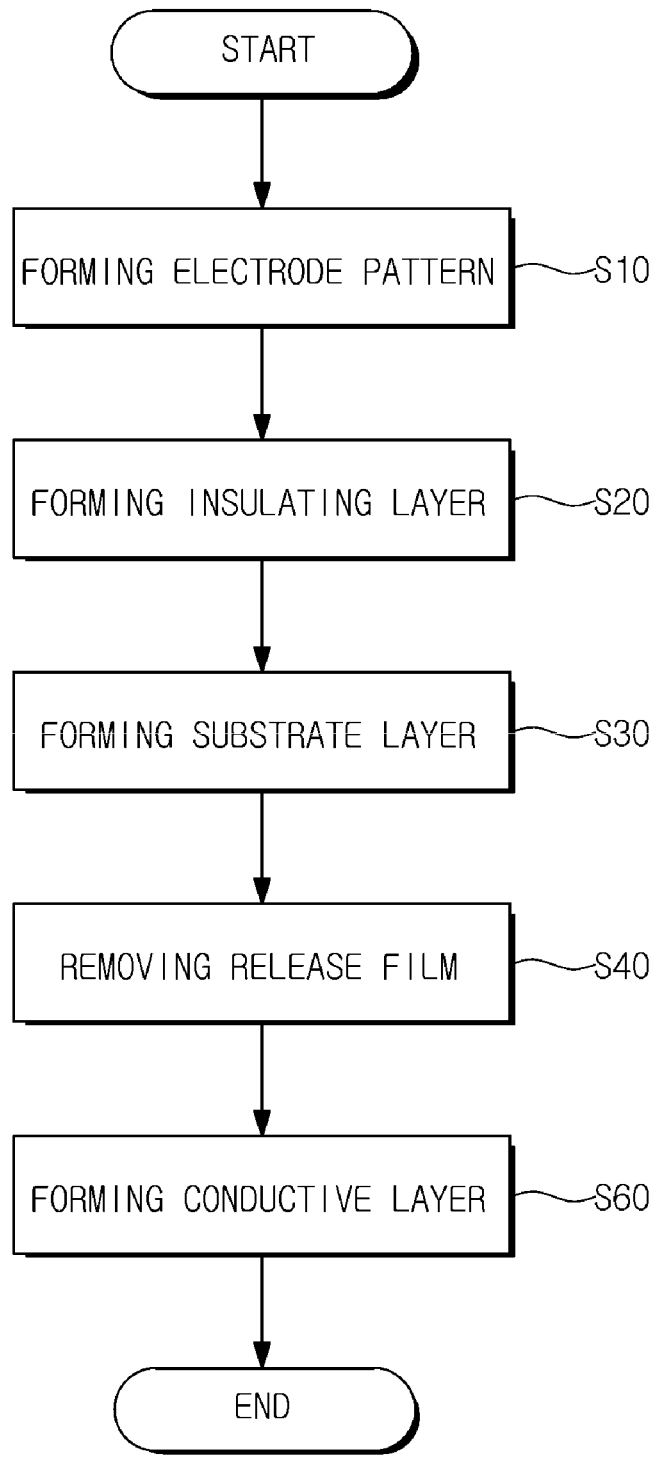
FIG. 1 is a flowchart sequentially showing a method for producing a transparent electrode film according to an embodiment of the present invention.

10: RELEASE FILM
11: THERMO-RESISTANT FILM
12: RELEASING AGENT
20, 21, 22, 23: ELECTRODE PATTERN
30: INSULATING LAYER
40: SUBSTRATE
50: RESIDUE METAL INK COMPOSITION
60, 61, 62, 63: CONDUCTIVE MATERIAL
70: DOCTOR BLADE

DETAILED DESCRIPTION

The advantages and features of the present invention, and methods for achieving those advantages and features will be apparent with reference to the following embodiments described in detail hereinafter. However, the present invention is not to be construed as limited to the following embodiments, but may be realized in a variety of configurations. Therefore, the following embodiments are merely intended to provide a scope of the present invention for one skilled in the art, and the present invention is to be defined within the scope of the claims. Like reference numerals refer to the same components through the specification.

Hereinafter, the present invention will be explained based on the drawings for explaining a method for producing a transparent electrode film according to embodiments of the present invention.

As illustrated in FIG. 1, a method for producing a transparent electrode film according to an embodiment of the present invention includes forming an electrode pattern (S10), forming an insulating layer (S20), forming a substrate layer (S30), removing a release film (S40), and forming a conductive layer (S60).

Forming Electrode Pattern (S10)

The step of forming an electrode pattern (S10) is a step of forming an electrode pattern using a metal ink composition on the release film.

The release film may be prepared by applying a releasing agent on a thermo-resistant film.

A release coat film of which the release force has been adjusted may be used as the release film. Herein, the release coat film may be produced by applying a releasing agent on a thermo-resistant film.

Examples of the thermo-resistant film that may be used herein include polyethylene naphthalate (PEN), polyethylene terephthalate (PET), polyethylene (PE), polyimide (PI), polycarbonate (PC), but without limitation. Thus, thermo-resistant films of various materials well known in the field may be used.

It is desirable that the releasing agent is a silicon-based releasing agent or acryl-based releasing agent.

Silicon-based releasing agents are more effective since they are advantageous in easily adjusting the release force and heat-resistance of not contracting severely even under a hot compression process. Thus, it is desirable to use a silicon-based releasing agent.

Examples of the releasing agents that may be used herein include various types well known in the field, and they may be used in combinations as well when necessary.

Examples of methods for applying the releasing agent on a thermo-resistant film that may be used herein include microgravure coating method, gravure coating method, slot die coating method, reverse kiss or rotary screen coating method, but without limitation.

The metal ink composition is printed on the surface of release film where the releasing agent is applied.

The metal ink composition may desirably comprise a metal complex compound, metal precursor, spherical metal particles, metal flakes, metal nano particles, or a combination thereof.

More desirably, a metal complex compound or metal precursor may be used. Furthermore, a metal complex compound or metal precursor may be reduced to nano size metal particles, and be used as a blend. By using this, it is possible to easily form a nano size electrode pattern that could not have been formed according to conventional techniques.

The metal precursor that may be used herein is represented as $M_nX$, wherein M is Ag, Au, Cu, Ni, Co, Pd, Ti, V, Mn, Fe, Cr, Zr, Nb, Mo, W, Ru, Cd, Ta, Re, Os, Ir, Al, Ga, Ge, In, Sn, Sb, Pb, or Bi; n is an integer of 1 to 10; and X represents oxygen, sulfur, halogen, cyano, cyanate, carbonate, nitrate, sulfate, phosphate, thiocyanate, chlorate, perchlorate, tetrafluoroborate, acetylacetonate, mercapto, amide, alkoxide, or carboxylate. For example, one or more of the following may be selected and used as the metal precursor: metal carboxylate such as gold acetate, palladium oxalate, 2-ethyl hexanoic acid silver, 2-ethyl hexanoic acid copper, iron stearate, nickel formate, and zinc citrate; a metal compound such as silver nitrate, copper cyanate, cobalt carbonate, platinum chloride, gold chloride, tetrabutoxy titanium, dimethoxy zirconium dichloride, aluminum isopropoxide, vanadium oxide, tantalum methoxide, bismuth acetate, dodecyl mercapto gold, indium acethyl acetonate and the like.

General methods for producing metal nano particles include physical methods of physically pulverizing a metal lump, and chemical producing methods.

More specifically, chemical methods include an aerosol method of spraying high-pressure gas for pulverization, pyrolysis method using a metal compound and a gas reductant for pyrolysis pulverization, condensation-evaporation method of heating and evaporating a subject material for pulverization, sol gel method, hydrothermal synthesis method, ultrasonic wave synthesis method, micro-emulsion method, and liquid reduction method.

The liquid reduction method is most widely used since it is regarded as easily forming and controlling nano particles and as most economical, but in the present invention, any method can be used as long as it forms nano particles.

A method for producing nano particles in a liquid reduction method is specifically explained in Korean Patent Application No. 2006-0074246 filed by the same applicant as the present invention. Advantages of Korean Patent Application No. 2006-0074246 include that the size of particles are uniform and their cohesiveness is minimized, and that it is possible to form a dense thin film or fine pattern having a high conductivity even when sintered for a short period of time under a low temperature of below 150° C.

Besides the metal conductive material, additives such as a solvent, stabilizer, dispersant, binder resin, releasing agent, reductant, surfactant, wetting agent, thixotropic agent, leveling agent, thickening agent and the like may be further included when necessary.

It is desirable that the binder resin has an excellent adhesion with various substrates. Examples of organic polymer that may be used as the binder resin include polypropylene, polycarbonate, polyacrylate, polymethylmethacrylate, celluloseacetate, polyvinylchloride, polyurethane, polyester, alkyd resin, epoxy resin, phenoxy resin, melamine resin, phenol resin, phenol-modified alkyd resin, epoxy-modified alkyd resin, vinyl-modified alkyd resin, silicon-modified alkyd resin, acryl melamine resin, polyisocyanate resin, epoxy ester resin and the like, but without limitation.

Furthermore, there are cases where a solvent is necessary in order to form a uniform thin film. Examples of the solvent that may be used include alcohols such as ethanol, isopropanol, and butanol; glycols such as ethyleneglycol and glycerin; acetates such as ethylacetate, butylacetate, methoxypropylacetate, carbitolacetate, and ethylcarbitolacetate; ethers such as methylcellosolve, butylcellosolve, diethylether, tetrahydrofuran, and dioxane; ketones such as methylethylketone, acetone, dimethylformamide, and 1-methyl-2-pyrolidone; hydrocarbons such as hexane, heptane, dodecane, paraffin oil, and mineral spirit; aromatics such as benzene, toluene, and xylene; halogenated solvent such as chloroform or methylenechloride, and carbontetrachloride; acetonitrile, dimethylsulfoxide, or a combination thereof, but without limitation.

The method for printing the metal ink composition on the release film surface may desirably include a gravure printing method, flexo printing method, offset printing method, reverse offset printing method, dispensing, screen printing method, rotary screen printing method, and inkjet printing method. Herein, the metal ink composition may be coated by one or more times repeatedly.

Since the print characteristics may vary depending on the metal content, content and volatile temperature of the solvent, viscosity, and thixotropicity characteristics, it is necessary to optimize the rheology of the composition to the filling method by adjusting the components of the conductive ink according to each method.

Forming Insulating Layer (S20)

The step of forming an insulating layer (S20) is a step of forming an insulating layer on the release film on which an electrode pattern has been formed at the step of forming an electrode pattern (S10).

The material constituting the insulating layer may desirably be a composition that comprises a thermosetting resin, an UV curable resin or a combination thereof.

There is no limitation to the resin composition as long as the composition allows various cross-linking reactions, but that has excellent thermo-resistance and light transmissivity.

The method for forming an insulating layer may be a well known conventional method, desirably an S-Knife coating method, gravure coating method, flexo coating method, screen coating method, rotary screen coating method, slot die or micro gravure coating method, but without limitation.

The height of the insulating layer between the fine electrode pattern may desirably be the same as or higher than the height of the fine electrode pattern, more desirably 0.1 µm or more higher than the height of the electrode pattern, and further desirably 1 µm or more higher than the height of the electrode pattern.

Furthermore, the insulating layer may be formed as a single layer, or as two or more layers formed by applying a curable resin two or more times on the release film on which the fine electrode pattern has been formed.

Forming Substrate Layer (S30)

The step of forming a substrate layer (S30) is a step of forming the substrate layer on the insulating layer formed at the step of forming insulating layer (S20).

Figure 3:
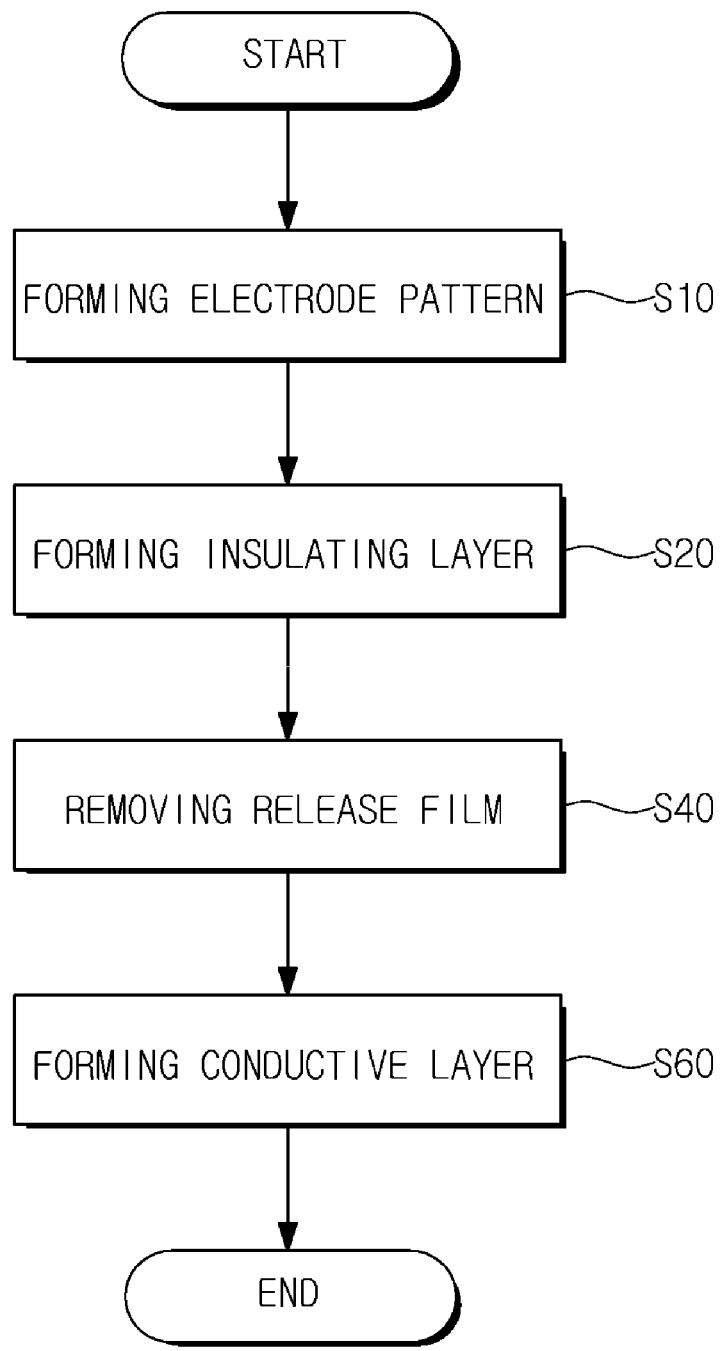
FIG. 3 is a flowchart sequentially showing a method for producing a transparent electrode film according to another embodiment of the present invention.

In the case where the insulating layer of the step of forming an insulating layer (S20) serves as a substrate, the step of forming a substrate layer (S30) may be omitted as can be seen from FIG. 3.

There is no particular limitation to the type of substrate. The substrate may be a transparent material, for example plastic film or glass. Examples of the plastic film that may be used herein includes polyimide (PI), polyethyleneterephthalate (PET), polyethylenenaphthalate (PEN), polyethersulfone (PES), nylon, polytetrafluoroethylene (PTFE), polyetheretherketone (PEEK), polycarbonate, and polyarylate (PAR). These types of plastic film or glass substrate may be used, but without limitation.

For example, a method for forming the substrate layer on the insulating layer may include a hot compression method or an adhesion method using an adhesive agent.

In the case of a hot compression, the substrate may be positioned on the insulating layer, and then the two layers may be compressed and laminated under a temperature condition of 100 to 300° C., desirably 120 to 200° C., and more desirably 140 to 175° C.

In some cases, the substrate may be laminated on the insulating layer of semi-cured state in B-stage.

Since the substrate is heat-compressed and laminated after the electrode pattern is printed, it is easy to be attached and has excellent adhesion force compared to when an electrode pattern is formed on a substrate, thereby improving the durability as the transparent electrode film.

Removing Release Film (S40)

The step of removing the release film (S40) is a step of producing the final transparent film by removing the release film.

Figure 2:
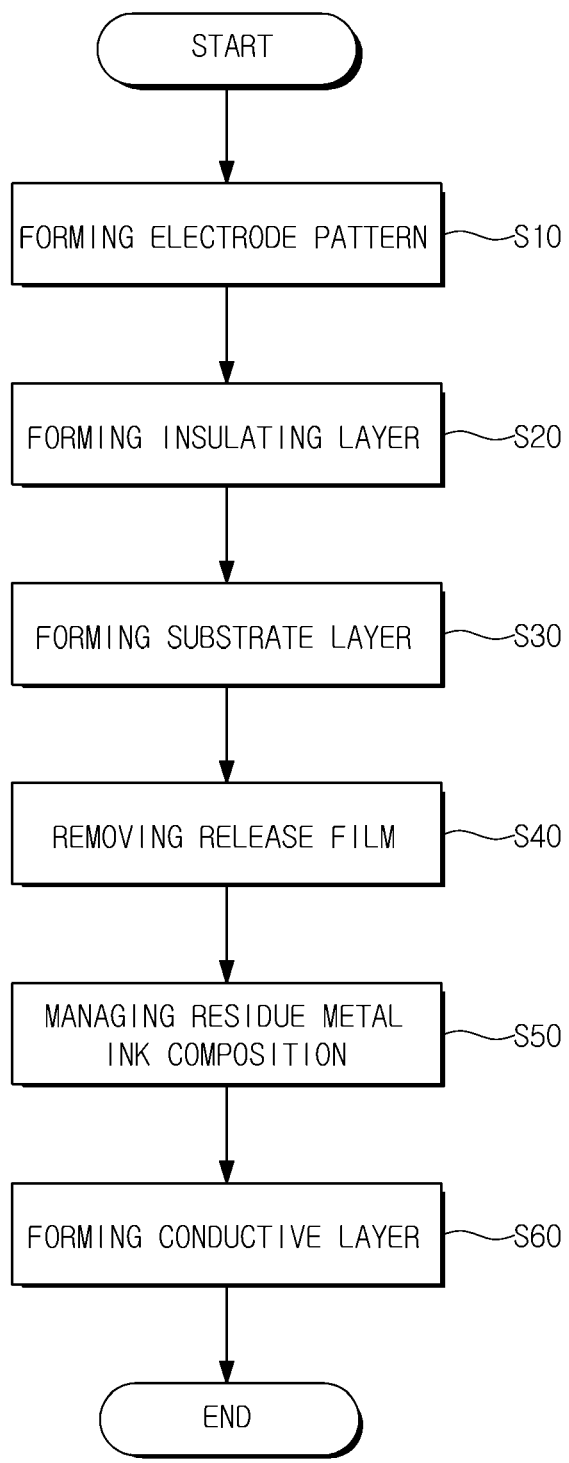
FIG. 2 is a flowchart sequentially showing a method for producing a transparent electrode film according to another embodiment of the present invention.

The final transparent film is produced by removing the release film, but in order to improve the reliability of the transparent electrode film, a step of managing a residue metal ink composition (S50) may be further included as in FIG. 2.

If there is no residue metal ink composition on the insulating layer after removing the release film, it is possible to carry out the step of forming the conductive material without managing the metal ink composition. Or the film may be used as the transparent electrode film after the step of managing the residue metal ink composition.

Not only that, it is possible to apply both the step of managing the metal ink composition and the step of forming the conductive material sequentially.

Managing Residue Metal Ink Composition (S50)

The step of managing a residue metal ink composition (S50) is a step of removing a metal ink composition remaining between the electrode pattern, thereby improving the transmissivity as the transparent electrode film.

The step of managing the residue metal ink composition (S50) is not a step that must be performed, but it is desirable to be performed in order to realize an excellent electrode pattern with low resistance.

There are cases where the metal ink composition remains in an area other than where the electrode pattern is formed during the electrode pattern is being printed on the surface of the releasing film using the metal ink composition at the step of forming electrode pattern (S10).

When the release film is removed, the residue metal ink composition remains on the insulating layer, and the fine metal particles included in the residue metal ink composition deteriorates the transmissivity of the transparent electrode film or causes a problem to the withstanding voltage of the transparent electrode film. Thus, by removing the residue metal ink composition, the characteristics of the transparent electrode can be significantly improved.

In order to dissolve the residue metal ink composition remaining between the electrode pattern on the insulating layer surface, it is possible to apply an etching solution on the insulating layer surface. The method for applying an etching solution may be performed by a generally well known coating method.

The etching solution may desirably include at least one of an ammonium carbamate compound, ammonium carbonate compound, ammonium bicarbonate compound, carboxylic acid compound, lactone compound, lactam compound, cyclic acid anhydride compound, acid-base complex compound, acid-base-alcoholic complex and mercapto compound, and an oxidizing agent.

For example, the etching solution may be prepared by reacting the oxidizing agent and one or more of the aforementioned compounds directly or in the presence of a solvent under normal pressure or pressurization. Examples of the solvent may include water; alcohols such as methanol, propanol, isopropanol, butanol, and ethanol amine; glycols such as ethylene glycol and glycerin; acetates such as ethylacetate, butyl acetate and carbitolacetate; ethers such as diethylether, tetrahydrofuran and dioxane; ketones such as methylethylketone and acetone; carbonhydrates such as hexane and heptane; aromatic compounds such as benzene and toluene; halogen-based solvent such as chloroform, methylene chloride and carbon tetrachloride; fluorine-based solvent such as perfluorocarbon, or a combination thereof. In a pressurized state such as in a pressure vessel, a fluorine-based solvent of a low boiling point, or liquefied carbon dioxide may be used. There is no particular limitation to the method for producing an etching solution of the present invention. That is, any generally well known method may be used as long as it is suitable to the purpose of the present invention.

Examples of the oxidizing agent that may be used in the etching solution include an oxidative gases such as oxygen and ozone; peroxides such as hydrogen peroxide, $Na_2O_2$, $KO_2$, $NaBO_3$, $(NH_4)S_2O_8$, $H_2SO_5$, $(CH_3)_3CO_2H$, $(C_6H_5CO_2)_2$ and the like; hyperoxidates such as $HCO_3H$, $CH_3CO_3H$, $CF_3CO_3H$, $C_6H_5CO_3H$, m-$ClC_6H_5$—$CO_3H$ and the like; generally well known oxidative inorganic acid such as nitric acid, sulfuric acid, iodine ($I_2$), $Fe(NO_3)_3$, $Fe_2(SO_4)_3$, $K_3Fe(CN)_6$, $(NH_4)_2Fe(SO_4)_2$, $Ce(NH_4)_4(SO_4)_4$, $NaIO_4$, $KMnO_4$, $K_2CrO_4$ and the like; and metal or nonmetallic compounds and the like. One of these oxidizing agents or a combination thereof may be used.

Desirably, hydrophilic characteristics may be provided to the etching solution in order to effectively dissolve the residue conductive ink remaining on the surface of the insulating layer. It is desirable to adjust the extent of hydrophilic property of the etching solution by adjusting the carbon number of the ammonium carbamate compound, ammonium carbonate compound, ammonium bicarbonate compound, carboxylic acid compound, lactone compound, lactam compound, cyclic acid anhydride compound, acid-base complex compound, acid-base-alcoholic complex, and mercapto compound.

Herein, the ammonium carbamate compound, ammonium carbonate compound, and ammonium bicarbonate compound are specifically explained in Korean Patent No. 0727466, and examples of the carboxylic acid compound that may be used herein include benzoic acid, oleic acid, propionic acid, malonic acid, hexanoic acid, octanoic acid, decanoic acid, neodecanoic acid, oxalic acid, citric acid, salicylic acid, stearic acid, acrylic acid, succinic acid, adipic acid, glycolic acid, isobutyric acid, ascorbic acid and the like.

Examples of the lactone compound that may be used herein include β-propiolactone, γ-propiolactone, γ-butyrolactone, γ-thiobutyrolactone, α-methyl-γ-butyrolactone, β-methyl-γ-butyrolactone, γ-valerolactone, γ-caprolactone, γ-octanoiclactone, δ-valerolactone, 1,6-dioxaspiro[4,4]nonane-2,7-dione, α-methylene-γ-butyrolactone, γ-methylene-γ-butyrolactone, ε-caprolactone, lactide, glycolide, tetronic acid, 2(5H)-furanone, β-hydroxy-γ-butyrolactone, mevaloniclactone, 5,6-dihydro-2H-pyran-2-pyran-2-one, δ-valerolactone, ε-caprolactone, γ-caprolactone, γ-octanoic lactone and the like.

Examples of the lactam compound that may be used herein include 2-azetidinone, 2-pyrrolidinone, 5-methoxy-2-pyrrolidinone, 5-methyl-2-pyrrolidinone, N-methylcaprolactam, 2-azacyclononanone, N-acetylcaprolactame and the like.

Examples of the cyclic acid anhydride that may be used herein include itaconic anhydride, succinic anhydride, maleic anhydride, glutaric anhydride, octadecyl succinic anhydride, 2,2-dimethyl succinic anhydride, 2-dodecene-1-yl succinic anhydride, hexafluoroglutaric anhydride, 3, 3-dimethylglutaric anhydride, 3-ethyl-3-methyl glutaric anhydride, 3,5-diacetyltetrahydropyran-2,4,6-trione, diglycolic anhydride, and the like.

Examples of the mercapto compound that may be used herein include 1-methane thiol, 1-ethane thiol, 2-butaine thiol, 1-heptane thiol, 1-octane thiol, 1-decane thiol, 1-hexadecane thiol, thioacetic acid, 6-mercaptohexanoic acid, thiobenzoic acid, furfuryl mercaptane, cyclohexanethiol, 11-mercapto-1-undecanol, 2-mercaptoethanol, 3-mercapto-1-propanol, thiosalicylic acid, 1-thioglycerol, 2-naphthalenethiol, methyl 3-mercaptopropionate, γ-mercaptopropyl trimethoxysilane and the like, but without limitation. One of these compounds or a combination thereof may be used.

The etching speed of the aforementioned etching solution may desirably be controlled by adjusting an soaking time of the etching solution during the coating process, or by adjusting the concentration of the oxidizing agent or of the ammonium carbamate compound, ammonium carbonate compound, ammonium bicarbonate compound, carboxylic acid compound, lactone compound, lactam compound, cyclic acid anhydride, acid-base complex, acid-base-alcoholic complex, or mercapto compound in the etching solution. And when necessary, the etching process may be repeated. Furthermore, in the case of an etching solution comprising an inorganic acid or base, the etching solution may be washed and removed using additional water or an organic solvent.

It is possible to push and remove the residue metal ink composition dissolved by the etching solution using physical force.

There is no limitation to a method or a managing member for pushing the dissolved residue metal ink composition, but a doctor blade, wiper or brush may be used. More desirably, a brush may be used. A brush may reduce the physical force thereby preventing scratches on the substrate surface and loss of ink.

This may be performed at least once, by various methods, especially, by the doctor blade, wiper, brush, or a combination thereof.

It is possible to push the residue ink composition dissolved using the residue managing member, thereby removing the metal material or organic material that are components of the residue metal ink composition remaining on the surface between the electrode pattern on the insulating layer.

Besides the above, additional vibration, fluctuation or air may be used as a way to push the dissolved residue metal ink composition.

Forming Conductive Layer (S60)

The step of forming a conductive material layer (S60) is a step of applying or printing a conductive material on the electrode pattern from which the release film has been removed so as to produce a hybrid type transparent electrode film.

This step may be added when necessary for a use in an internal electrode of a device.

Furthermore, the step of forming a conductive material layer (S60) may be performed right after the step of removing the release film (S40) or the step of removing the residue metal ink composition (S50), and when a conductive material is formed on the electrode pattern after the residue metal ink composition is removed, it is possible to realize a transparent electrode film with a high reliability.

The conductive material that may be formed on the electrode pattern may desirably be ITO, AZO, CNT, graphene or conductive polymer, wherein the conductive polymer may be PEDOT(poly(3,4-ethylenedioxythiophene)) or PEDOT:PSS (poly(3,4-ethylenedioxythiophene):poly(4-styrenesulfonate)).

The conductive material may be deposited and patterned on the pattern electrode or directly printed thereon. The materials of ITO or AZO may desirably be vacuum-sputtered in a target format or made into ink and then printed as a thin film coating composition.

Such a hybrid type transparent electrode film has excellent interfacial properties between two electrodes, and thus it may be used in applications where require high conductivity and high reliability.

The aforementioned step for producing a transparent electrode film may be performed by a roll-to-roll continuous process which increases the production speed and thus the producing efficiency.

Hereinafter, the present invention will be explained in detail with reference to FIG. 4.

FIGS. 4a to 4j are cross-sectional views sequentially showing a method for producing a transparent electrode film according to an example of the present invention.

Figure 4A:
FIG. 4a to FIG. 4j are cross-sectional views sequentially showing a method for producing a transparent electrode film according to an embodiment of the present invention.

As illustrated in FIG. 4a, a thermo-resistant film 11 is prepared. The thermo-resistant film 11 may be one of a variety of films made of a material such as PEN, PET, PE, PL, and PC.

Figure 4B:
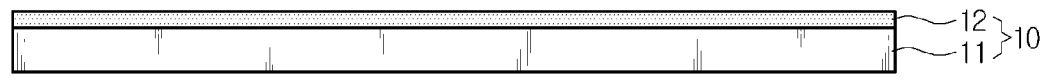

FIG. 4b illustrates producing a release film 10 by applying a releasing agent 12 on the thermo-resistant film 11. There is no limitation to the release film 10 as long as it has a release force, but it is desirable that the release film 10 is a thermo-resistant release coat film of which the thermo-resistance has been adjusted.

Since a process of laminating the substrate layer 40 by a hot compression method follows, it is desirable that the releasing agent 12 has thermo-resistant characteristics such that it does not contract severely even under a hot compression process. It is effective to use a silicon releasing agent.

Figure 4C:
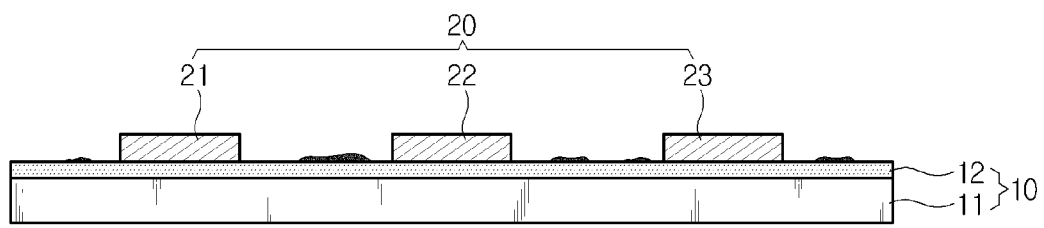

Then, as illustrated in FIG. 4c, an electrode pattern 20 is formed on the release film 10.

Since the release film 10 is to be removed, the electrode pattern 20 in a mesh format is printed on top of the releasing agent 12 having excellent release force.

The metal ink composition may be formed using a metal complex compound or metal precursor, and it may be printed by a gravure printing method, flexo printing method, offset printing method, reverse offset printing method, dispensing, screen printing method, rotary screen printing method or inkjet printing method, but without limitation.

The printing of the metal ink composition is not limited to once, but may be repeated depending on needs.

The electrode pattern 20 is printed using the metal ink composition, and since the metal ink composition may remain in an area other than where the electrode pattern 20 is formed during printing, a step of managing the residue metal ink composition 50 may be further added.

Figure 4D:
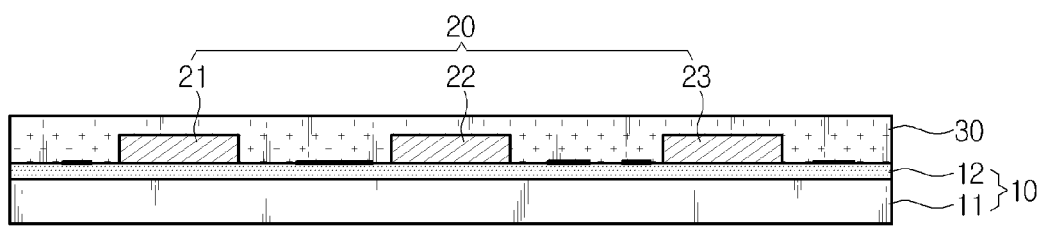

Then, as illustrated in FIG. 4d, a thermosetting or UV curable resin may be applied on the surface of the releasing agent 12 where the electrode pattern 20 is printed so as to form an insulating layer 30.

As illustrated in the drawings, it is effective that the height of the insulating layer 30 is higher than the height of the electrode pattern 20, and desirably 0.1 μm or more than the height of the electrode pattern, and more desirably 1 μm or more than the height of the fine electrode pattern.

Figure 4E:
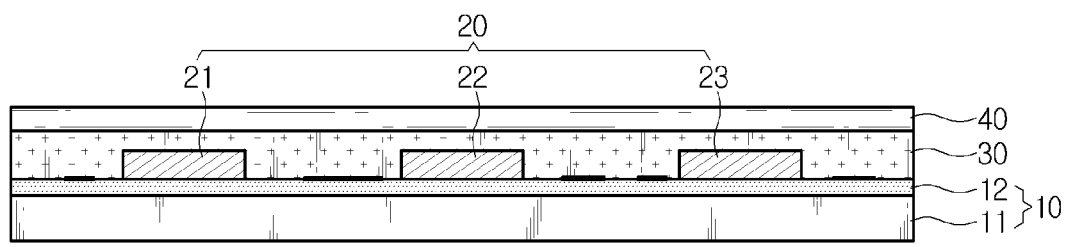

After the insulating layer 30 is formed, a substrate layer 40 is laminated on the insulating layer 30 as illustrated in FIG. 4e.

There is no limitation to the type of the substrate of the substrate layer 40, and a transparent material such as plastic film or glass may be used as the substrate.

It is desirable that the substrate is heat-compressed at a temperature of 100 to 300° C., and then laminated on the insulating layer 30. Otherwise, it is also possible to apply an adhesive agent on the insulating layer to attach the substrate.

In the case of bonding the substrate using an adhesive agent, a transparent adhesive agent may desirably be used, and examples of the adhesive agents may include one or more of polyvinylalcohol-based adhesive agent, acryl-based adhesive agent, vinylacetate-based adhesive agent, urethane-based adhesive agent, polyester-based adhesive agent, polyolefin-based adhesive agent, and polyvinylalkylether-based adhesive agent.

There is no limitation to the thickness of an adhesive layer. The thickness of the adhesive layer may be set to a generally acceptable thickness in consideration of the properties.

Figure 4F:
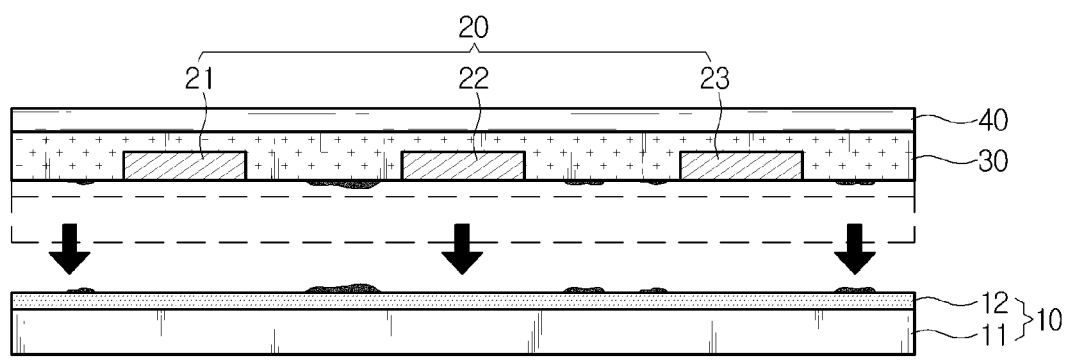

After laminating the substrate, the release film 10 may be removed so as to produce a transparent electrode film. This is illustrated in FIG. 4f.

By adjusting the release force of the releasing agent 12 of the release film 10, the release film 10 is separated from the insulating layer 30 where the electrode pattern is formed.

Figure 4G:
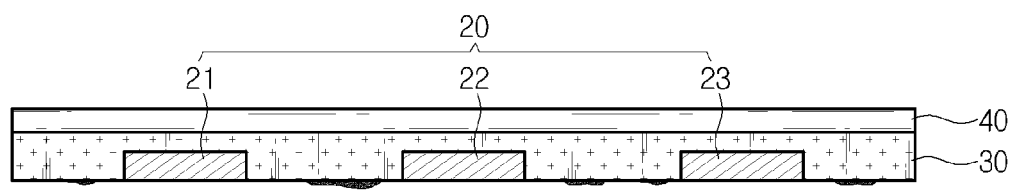

Therefore, as illustrated in FIG. 4g, since the electrode pattern 20 is exposed to outside, it is possible to realize a transparent electrode film for display having excellent surface roughness.

Figure 4H:
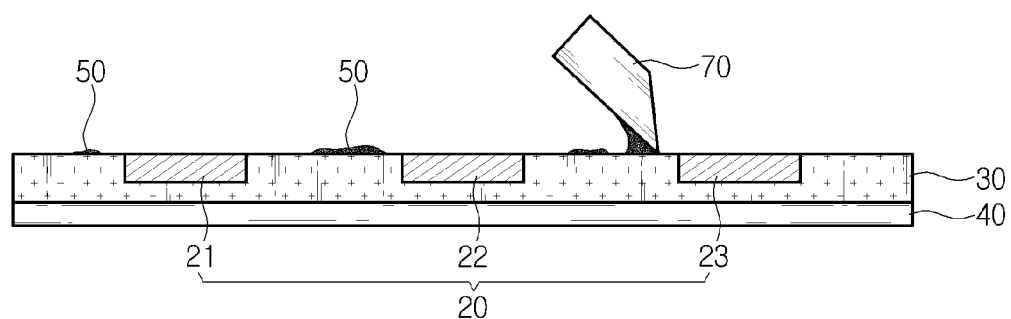
Figure 4I:
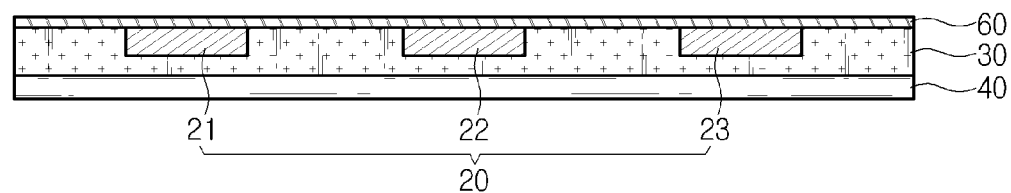
Figure 4J:
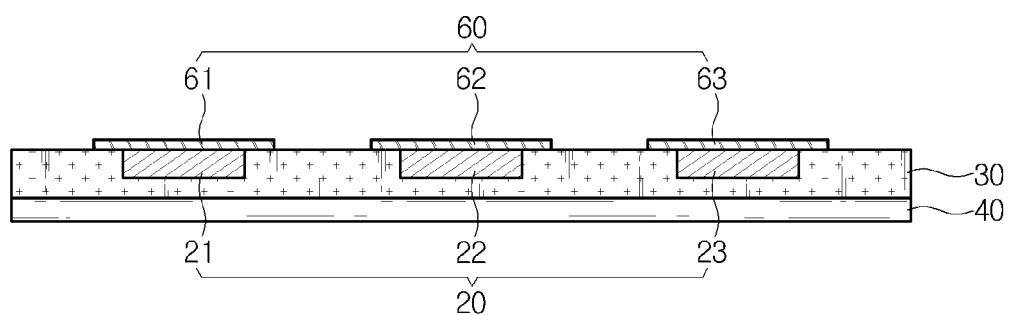

In order to improve the reliability of the transparent electrode film, processes of FIGS. 4h, 4i, and 4j may be additionally performed.

According to FIG. 4h, as aforementioned, when printing the metal ink composition to form an electrode pattern 20, the metal ink composition may remain in areas where the electrode pattern 20 is not formed, and since there still remains the metal ink composition on the insulating layer 30 after removing the release film 10, a process of removing the residue metal ink composition may be additionally performed.

By dissolving the residue metal ink composition 50 and pushing it, it is possible to remove the metal material or organic material from the area other than where the electrode pattern has been formed.

It is desirable to control a concentration of the etching solution or a soaking speed of the etching solution depending on the amount of the residue metal ink composition 50.

Various physical forces may be used to push the dissolved residue metal ink composition, but in the drawings, the doctor blade 70 was used. This may be performed once or more times, and various types of squeezes may be used.

By removing the residue metal ink composition 50, it is possible to improve the withstanding voltage characteristics and transmissivity.

As can be seen from FIG. 4i and FIG. 4j, it is possible to form a conductive material on an electrode pattern.

As can be seen from FIG. 4i, a hybrid type transparent electrode film may be formed by printing a conductive material such as ITO, AZO, NT, graphene, and conductive polymer on an insulating layer 30 where the electrode pattern 20 is formed, and then etching the same as illustrated in FIG. 4j.

This does not necessary have to be performed after the process of FIG. 4h. The conductive material may of course be formed on the transparent electrode film of FIG. 4g from which the release film 10 has been removed.

The sheet resistance of the transparent electrode film for display produced as aforementioned may be 10 mΩ to 100 kΩ, more desirably 10 mΩ to 10 kΩ.

Furthermore, the transmissivity of the transparent electrode film for display of the present invention may be 60 to 99%, more desirably 70 to 99%.

Hereinafter, the present invention will be explained in detail based on the Examples. The present invention is not limited to the Examples.

EXAMPLE 1

A metal ink composition was produced by mixing 26.51 g of conductive paste (Inktec) and 0.45 g of terpineol in 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 60 μm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was applied in a thickness of 50 nm on the printed electrode surface wherein the insulating layer was used as the substrate using a sputter device, thereby producing a hybrid transparent electrode film.

EXAMPLE 2

A metal ink composition was produced by mixing 26.51 g of conductive paste (Inktec) and 0.45 g of terpineol with 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 70 μm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was deposited in a thickness of 50 nm on the printed electrode surface wherein the insulating layer was used as the substrate using a sputter device, thereby producing a hybrid transparent electrode film.

EXAMPLE 3

A metal ink composition was produced by mixing 26.51 g of conductive paste (Inktec) and 0.45 g of terpineol with 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 80 μm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was applied in a thickness of 50 nm on the printed electrode surface wherein the insulating layer was used as the substrate using a sputter device, thereby producing a hybrid transparent electrode film.

EXAMPLE 4

A metal ink composition was produced by mixing 26.51 g of conductive paste (Inktec) and 0.45 g of terpineol with 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 90 μm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was applied in a thickness of 50 nm on the printed electrode surface wherein the insulating layer was used as the substrate using a sputter device, thereby producing a hybrid transparent electrode film.

EXAMPLE 5

A metal ink composition was produced by mixing 26.51 g of conductive paste (Inktec) and 0.45 g of terpineol with 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 60 µm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was applied in a thickness of 100 nm on the printed electrode surface wherein the insulating layer was used as the substrate using a sputter device, thereby producing a hybrid transparent electrode film.

EXAMPLE 6

A metal ink composition was produced by mixing 26.51 g of conductive paste (Inktec) and 0.45 g of terpineol with 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 70 µm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was applied in a thickness of 100 nm on the printed electrode surface wherein the insulating layer was used as the substrate using a sputter device, thereby producing a hybrid transparent electrode film.

EXAMPLE 7

A metal ink composition was produced by mixing 26.51 g of conductive paste (Inktec) and 0.45 g of terpineol with 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 80 µm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was applied in a thickness of 100 nm on the printed electrode surface wherein the insulating layer is used as the substrate using a sputter device, thereby producing a hybrid transparent electrode film.

EXAMPLE 8

A metal ink composition was produced by mixing 26.51 g of conductive paste (Inktec) and 0.45 g of terpineol with 3.04 g of coating ink (Inktec) and stirring the mixture for 6 minutes at 1000 rpm using a paste mixer (Daewha tech). The metal ink composition was applied on a screen net having a certain electrode pattern design, and then an electrode was printed in a thickness of 90 µm on top of a release film (SKC, SG32) using a squeegee, and then a UV curable resin (Minuta Technology, MIR-30) was applied on top of the printed electrode in a uniform thickness, and then the insulating layer was cured using a UV curer. The cured insulating layer was separated together with the electrode printed on the release film, thereby producing an electrode wherein the insulating layer is used as the substrate. An ITO film was applied in a thickness of 100 nm on the printed electrode surface wherein the insulating layer was used as the substrate using a sputter device, thereby producing a hybrid transparent electrode film.

EXAMPLE 9

A conductive paste (Inktec) was applied on a screen net having a certain electrode pattern design, and then an electrode was printed in a thickness of 60 µm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 50 nm on the surface of the printed electrode wherein the insulating layer is used as the substrate using a sputter device, thereby producing a hybrid transparent electrode film.

EXAMPLE 10

A conductive paste (Inktec) was applied on a screen net having a certain electrode pattern design, and then an electrode was printed in a thickness of 70 µm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 50 nm on the surface of the printed electrode wherein the insulating layer is used as the substrate using a sputter device, thereby producing a hybrid transparent electrode film.

EXAMPLE 11

A conductive paste (Inktec) was applied on a screen net having a certain electrode pattern design, and then an electrode was printed in a thickness of 80 µm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 50 nm on the surface of the printed electrode wherein the insulating layer is used as the substrate using a sputter device, thereby producing a hybrid transparent electrode film.

EXAMPLE 12

A conductive paste (Inktec) was applied on a screen net having a certain electrode pattern design, and then an electrode was printed in a thickness of 90 μm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 50 nm on the surface of the printed electrode wherein the insulating layer is used as the substrate using a sputter device, thereby producing a hybrid transparent electrode film.

EXAMPLE 13

A conductive paste (Inktec) was applied on a screen net having a certain electrode pattern design, and then an electrode was printed in a thickness of 60 μm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 100 nm on the surface of the printed electrode wherein the insulating layer is used as the substrate using a sputter device, thereby producing a hybrid transparent electrode film.

EXAMPLE 14

A conductive paste (Inktec) was applied on a screen net having a certain electrode pattern design, and then an electrode was printed in a thickness of 70 μm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 100 nm on the surface of the printed electrode wherein the insulating layer is used as the substrate using a sputter device, thereby producing a hybrid transparent electrode film.

EXAMPLE 15

A conductive paste (Inktec) was applied on a screen net having a certain electrode pattern design, and then an electrode was printed in a thickness of 80 μm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 100 nm on the surface of the printed electrode wherein the insulating layer is used as the substrate using a sputter device, thereby producing a hybrid transparent electrode film.

EXAMPLE 16

A conductive paste (Inktec) was applied on a screen net having a certain electrode pattern design, and then an electrode was printed in a thickness of 90 μm on top of a release film (SKC, SG32) using a squeegee, and then a UV curable resin (Minuta Technology, MIR-30) was applied in a uniform thickness on the printed electrode, and then the insulating layer was cured using a UV curer. The cured insulating layer was separated together with the electrode printed on top of the release film, thereby producing an electrode wherein the insulating layer is used as the substrate. An ITO film was applied in a thickness of 100 nm on the surface of the printed electrode wherein the insulating layer is used as the substrate using a sputter device, thereby producing a hybrid transparent electrode film.

Table 1 below shows the measurements of decreased rates of efficiency compared to initial efficiency after bending the hybrid transparent electrode produced according to the Examples 300 times using a bending test device with a diameter of 10 mm in order to identify the bending properties of the hybrid transparent electrodes of the present invention.

TABLE 1

| | Bending property ($\Omega$, 3000 times, 10 mm) | | |
|---|---|---|---|
| | Before ($R_0$) | After (R) | $[(R - R_0)/R_0] \times 100$ (%) |
| Example 1 | 24.4 | 17.9 | −27 |
| Example 2 | 19 | 16.6 | −13 |
| Example 3 | 15.6 | 13.2 | −15 |
| Example 4 | 13.6 | 16.5 | 21 |
| Example 5 | — | 74.1 | — |
| Example 6 | — | 80.1 | — |
| Example 7 | — | 37.7 | — |
| Example 8 | 47.9 | 44.6 | −7 |
| Example 9 | 24 | 14.7 | −39 |
| Example 10 | 18.8 | 12.1 | −36 |
| Example 11 | 15.6 | 10.4 | −33 |
| Example 12 | 13.5 | 9.4 | −30 |
| Example 13 | — | 52.1 | — |
| Example 14 | — | 53.5 | — |
| Example 15 | 83.5 | 48.3 | −42 |
| Example 16 | 52.8 | 35.7 | −32 |

The hybrid electrodes produced according to the Examples of the present invention showed better performance stability than conventional hybrid electrodes in the bending test.

That is, the transparent electrodes of the present invention have excellent mechanical properties and bending characteristics, and may thus be easily applied to flexible displays having durability.

While this disclosure includes desirable embodiments of the present invention, various changes in form and details may be made in these embodiments without departing from the spirit and scope of the claims and their equivalents. Therefore, the aforementioned description of the present invention does not limit the scope of the present invention defined by the limitations of the claims.

INDUSTRIAL FEASABILITY

According to the method for producing a transparent electrode film of the present disclosure, it is possible to provide a transparent electrode film for display having excellent surface roughness and resistance characteristics.

What is claimed is:

1. A method for producing a transparent electrode film, the method comprising:
    forming an electrode pattern by printing an electrode pattern on a release film using a metal ink composition;
    forming an insulating layer by applying a curable resin on the release film on which the electrode pattern has been formed;
    after forming the insulating layer, removing the release film;
    managing residue metal ink composition by removing a residue metal ink composition that remains between the electrode pattern when printing the electrode pattern at the forming an electrode pattern, after the removing of the release film; and
    forming a conductive layer by applying a conductive material on the electrode pattern from which the release film has been removed, wherein the insulating layer serves as a substrate.

2. The method according to claim 1, wherein the release film is formed by applying a silicon-based or acryl-based releasing agent on a thermo-resistant film.

3. The method according to claim 1, wherein the metal ink composition comprises at least one of a metal complex compound, metal precursor, spherical metal particles, metal plate and metal nano particles.

4. The method according to claim 1, wherein the electrode pattern is printed on a surface of the release film by a gravure printing method, flexo printing method, offset printing method, reverse offset printing method, dispensing, screen printing method, rotary screen printing method, or inkjet printing method.

5. The method according to claim 1, wherein the forming an insulating layer includes applying the curable resin on an entire surface of the release film on which the electrode pattern has been formed such that grooves between the electrode pattern are filled.

6. The method according to claim 1, wherein a height of the insulating layer between the electrode pattern is the same or higher than a height of the electrode pattern.

7. The method according to claim 1, wherein the forming an insulating layer includes forming two or more insulating layers by applying the curable resin two or more times.

8. The method according to claim 1, wherein the managing residue metal ink composition includes removing the residue metal ink composition by dissolving the residue metal ink composition using an etching solution, and pushing the dissolved residue metal ink composition using a residue managing member.

9. The method according to claim 8, wherein the etching solution comprises at least one of an ammonium carbamate compound, ammonium carbonate compound, ammonium bicarbonate compound, carboxylic acid compound, lactone compound, lactam compound, cyclic acid anhydride compound, acid-base complex, acid-base-alcoholic complex and mercapto compound, and an oxidizing agent.

10. The method according to claim 8, wherein the residue managing member is a doctor blade, wiper, or brush.

11. The method according to claim 1, wherein the forming of the conductive layer includes depositing or printing the conductive material on the electrode pattern from which the release film has been removed.

12. The method according to claim 1, wherein the conductive material is ITO, AZO, CNT, graphene, or conductive polymer.

13. The method according to claim 1, wherein the curable resin is a thermosetting resin or UV curable resin.

* * * * *